(12) United States Patent
Kawano

(10) Patent No.: US 6,326,835 B1
(45) Date of Patent: Dec. 4, 2001

(54) INPUT/OUTPUT CIRCUIT FOR SEMICONDUCTOR INTEGRATED CIRCUIT DEVICE

(75) Inventor: Harumi Kawano, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/679,509

(22) Filed: Oct. 5, 2000

(51) Int. Cl.[7] .................................................. G05F 1/10
(52) U.S. Cl. ............................................. 327/537; 327/534
(58) Field of Search ................................. 327/108, 111, 327/112, 534, 537, 427, 434–437; 326/27, 81, 83, 87

(56) References Cited

U.S. PATENT DOCUMENTS

| | | | |
|---|---|---|---|
| 5,300,832 | 4/1994 | Rogers | 326/57 |
| 5,418,476 | 5/1995 | Strauss | 326/58 |
| 5,444,397 | * 8/1995 | Wong et al. | 326/81 |
| 5,546,020 | 8/1996 | Lee et al. | 326/83 |
| 5,990,705 | * 11/1999 | Lim | 326/81 |
| 6,040,711 | * 3/2000 | Airaksinen et al. | 326/81 |
| 6,078,197 | 6/2000 | Kawano | 327/108 |
| 6,208,178 | * 3/2001 | Chen | 327/108 |

FOREIGN PATENT DOCUMENTS

| | | | |
|---|---|---|---|
| 6-216752 | 8/1994 | (JP) | H03K/19/00 |
| 7-297701 | 11/1995 | (JP) | H03K/19/003 |
| 8-8715 | 1/1996 | (JP) | H03K/19/00 |
| 8-237102 | 9/1996 | (JP) | H03K/19/0175 |

* cited by examiner

*Primary Examiner*—Toan Tran
(74) *Attorney, Agent, or Firm*—Volentine Francos, PLLC

(57) ABSTRACT

An output circuit includes an output terminal connected to an external circuit; an internal power supply terminal; a first node in a floating state; a second node; a third node; a first MOS transistor; and a second MOS transistor. The first MOS transistor includes a first terminal connected to the internal power supply terminal, a second terminal connected to the output terminal, a gate connected to the second node and a substrate terminal connected to the first node. The second MOS transistor includes a gate connected to the internal power supply terminal, a first terminal connected to the second node, a second terminal connected to the third node and a substrate terminal connected to the first node.

24 Claims, 17 Drawing Sheets

INPUT/OUTPUT CIRCUIT FOR SEMICONDUCTOR INTEGRATED CIRCUIT DEVICE

TECHNICAL FIELD OF THE INVENTION

The present invention relates to a semiconductor integration circuit; and more particularly to an input/output circuit used therein.

BACKGROUND OF THE INVENTION

A conventional output circuit used in a semiconductor integrated circuit device, for example, includes a signal input terminal, an enable signal terminal, an inverter, a 2-input NAND circuit, a 2-input NOR circuit, a PMOS transistor, an NMOS transistor, a power supply terminal supplied with a 3 V power supply potential, a ground terminal supplied with a ground potential, and an output terminal.

The signal input terminal is connected to one input terminal of each of the 2-input NAND circuit and the 2-input NOR circuit. The enable signal input terminal is connected to the other input terminal of the 2-input NAND circuit and the signal input terminal of the inverter circuit. The output terminal of the inverter circuit is connected to the other input terminal of the 2-input NOR circuit. The output terminal of the 2-input NAND circuit is connected to the gate electrode of the PMOS transistor, while the output terminal of the 2-input NOR circuit is connected to the gate electrode of the NMOS transistor. The PMOS transistor is connected between the power supply terminal (3 V) and the output terminal. The N-well in the substrate of the PMOS transistor is connected to the 3 V power supply terminal. The NMOS transistor is connected between the ground terminal and the output terminal, while the substrate of NMOS transistor (P-well) is connected to the ground terminal.

The operation of this circuit will now be described. First of all, when an 'L' level signal (0 V) is inputted to the enable signal input terminal as an input signal, the output of the 2-input NAND circuit becomes an 'H' level and the output of the 2-input NOR circuit becomes an 'L' level. Accordingly, the PMOS transistor and the NMOS transistor are turned off. As a result, the output terminal is in a floating state totally unrelated to an input signal to the signal input terminal.

Next, when an 'H' level signal is input to the enable signal input terminal as an input signal, if an 'L' level signal is input to the signal input terminal the PMOS transistor is turned off and the NMOS transistor is turned on. As a result, the output terminal outputs an 'L' level signal. On the other hand, if an 'H' level signal is input to the signal input terminal, the PMOS transistor is turned on and the NMOS transistor is turned off. As a result, the output terminal outputs an 'H' level signal.

However, in the conventional output circuit, when the output terminal is connected to an external element having a power supply voltage higher than 3 V, for example a bus etc. supplying signals of 5 V, there are circumstances in which the 5 V voltage can be applied to the output terminal while the output terminal is in the floating state. If a 5 V voltage is applied to the output terminal, the drain (P active) of the PMOS transistor becomes 5 V. Because the substrate (N-well) of this PMOS transistor is connected to the 3 V power supply terminal, the diode across the drain (P active) and the substrate (N-well) is forward biased, and so current flows in this diode across the drain and the substrate. This means that if a voltage of 5 V is applied to the output terminal due to the influence of the bus etc. having a 5 V signal supplied to it, there is a possibility of leakage current of a number of mA flowing in the path from the bus supplied with a 5 V signal, to the output terminal, to the drain of the PMOS transistor, to the substrate of the PMOS transistor, to power supply terminal of the output circuit.

OBJECTS OF THE INVENTION

Accordingly, an object of the present invention is to provide an output circuit, in which a leak current can be prevented even if an external supply voltage that is higher than an internal supply voltage is applied to an output terminal.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, an output circuit includes an output terminal (OUT) connected to an external circuit; an internal power supply terminal (VDD); a first node (FL) in a floating state; a second node (30); a third node (37); a first MOS transistor (P8); and a second MOS transistor (P1). The first MOS transistor (P8) includes a first terminal connected to the internal power supply terminal (VDD), a second terminal connected to the output terminal (OUT), a gate connected to the second node (30) and a substrate terminal connected to the first node (FL). The second MOS transistor (P1) includes a gate connected to the internal power supply terminal (VDD), a first terminal connected to the second node (30), a second terminal connected to the third node (37) and a substrate terminal connected to the first node (FL).

According to a second aspect of the present invention, an output circuit includes an output terminal (OUT) connected to an external circuit; an internal power supply terminal (VDD); a first node (FL) in a floating state; a second node (30); a third node (37); a first MOS transistor (P8); a seventh MOS transistor (P3); and an eighth MOS transistor (P4). The first MOS transistor (P8) having a first terminal connected to the internal power supply terminal (VDD), a second terminal connected to the output terminal (OUT), a gate connected to the second node (30) and a substrate terminal connected to the first node (FL). The seventh MOS transistor (P3) having a first terminal connected to the second node (30), a second terminal connected to the first node (FL) and a substrate terminal connected to the first node (FL). The eighth MOS transistor (P4) having a gate connected to the third node (37), a first terminal connected to the second terminal of the third MOS transistor (P3), a second terminal connected to the first node (FL) and a substrate terminal connected to the first node (FL).

According to a third aspect of the present invention, an output circuit includes an output terminal (OUT) connected to an external circuit; an internal power supply terminal (VDD); a first node (FL) in a floating state; a second node (30); a third node (37); a first MOS transistor (P8); a second MOS transistor (P1); a seventh MOS transistor (P3); and an eighth MOS transistor (P4). The first MOS transistor (P8) has a first terminal connected to the internal power supply terminal (VDD), a second terminal connected to the output terminal (OUT), a gate connected to the second node (30) and a substrate terminal connected to the first node (FL). The second MOS transistor (P1) has a gate connected to the internal power supply terminal (VDD), a first terminal connected to the second node (30), a second terminal connected to the third node (37) and a substrate terminal connected to the first node (FL). The seventh MOS transistor (P3) having a first terminal connected to the second node (30), a second terminal connected to the first node (FL) and a substrate terminal connected to the first node (FL). The eighth MOS transistor (P4) having a gate connected to the third node (37), a first terminal connected to the second terminal of the third MOS transistor (P3), a second terminal connected to the first node (FL) and a substrate terminal connected to the first node (FL).

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
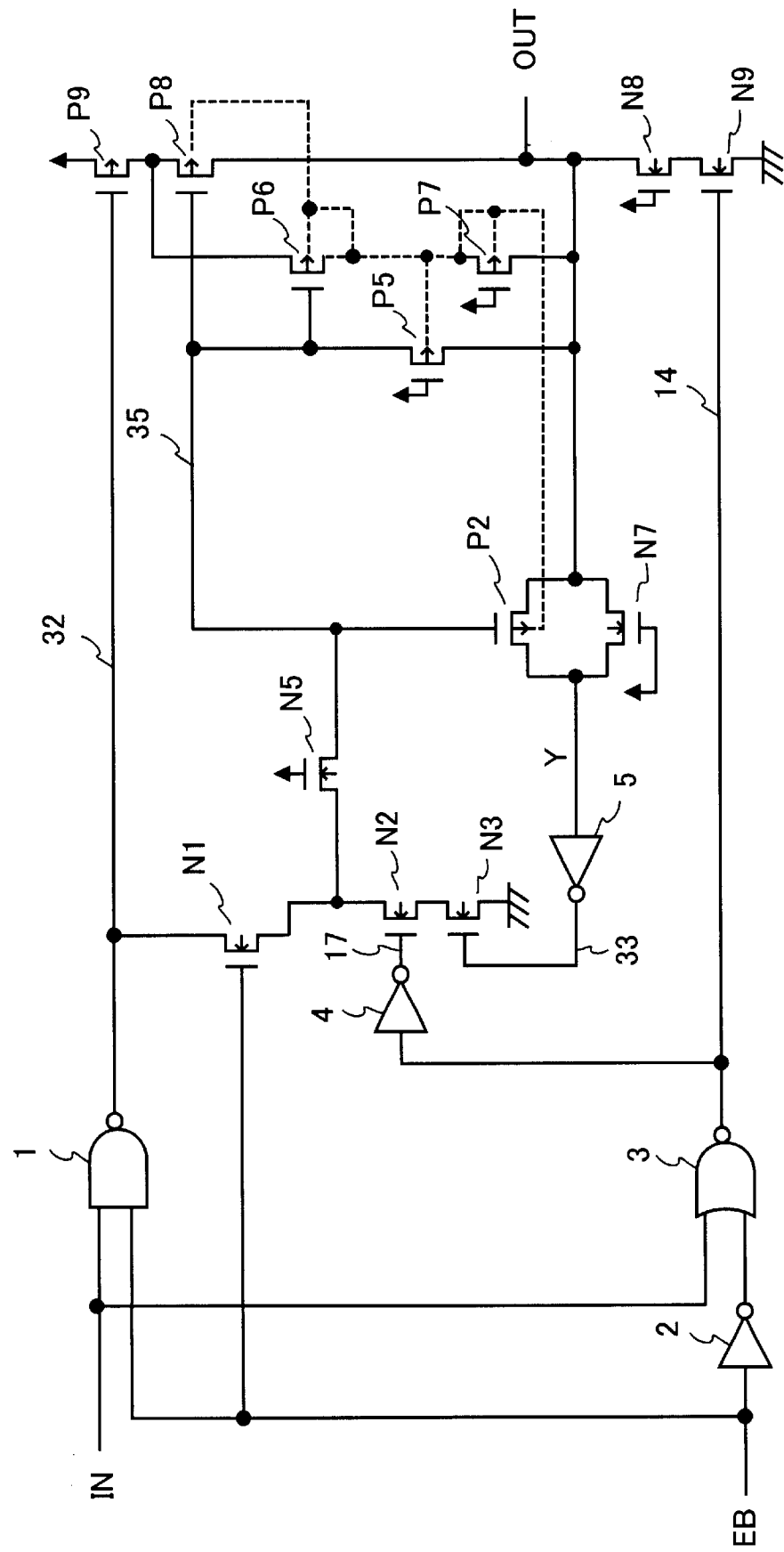
FIG. 1 is a block diagram illustrating a conventional tri-state output circuit used in a semiconductor integrated circuit.

For better understanding of the present invention, a conventional technology is first described. FIG. 1 shows a conventional tri-state output circuit. The conventional tri-state output circuit includes a NAND gate 1; inverters 2, 4 and 5; a NOR gate 3, NMOS transistors N1, N2, N3, N5, N7, N8 and N9; and PMOS transistors P2, P5, P6, P7, P8 and P9. The NAND gate 1 has input terminals connected to a signal input terminal IN and to an enable signal input terminal (EB terminal) EB. The signal input terminal IN is also connected to an input terminal of the NOR circuit 3. The EB terminal is also connected to an input terminal of the inverter 2, output terminal of which is connected to the other input terminal of the NOR circuit 3.

The NAND circuit 1 is connected at an output terminal to a node 32 that is connected to a gate of the PMOS transistor P9 and a drain of the NMOS transistor N1. The NMOS transistor N1 is connected at a gate to the EB terminal. The NOR gate 3 is connected at an output terminal to a node 14 that is connected to an input terminal of the inverter 4 and a gate of the NMOS transistor P9. The inverter 4 is connected at an output terminal to a node 17 connected to a gate of the NMOS transistor N2. The NMOS transistor N1 is connected at a source to drains of the NMOS transistors N2 and N5. The NMOS transistor N2 is connected at a source to a drain of the NMOS transistor N3. The NMOS transistor N3 is connected at a source to the ground and at a gate to a node 33 connected to an output terminal of the inverter 5.

The NMOS transistor N5 is connected at a gate to a power supply terminal; and at a source to a node 35 that is connected to gates of the PMOS transistors P2, P6 and P8 and a source of the PMOS transistor P5. The inverter 5 is connected at an input terminal to sources of the PMOS transistor P2 and NMOS transistor N7. The NMOS transistor N7 is connected at a gate to the power supply terminal and at a drain to a drain of the PMOS transistor P2. The drains of the PMOS transistor P2 and NMOS transistor N7 are connected to an output terminal OUT, which is connected to drains of the PMOS transistors P5, P7 and P8 and NMOS transistor N8.

The NMOS transistor N8 is connected at a gate to the power supply terminal and at a source to a drain of the NMOS transistor N9. The NMOS transistor N9 is connected at a source to the ground. The PMOS transistor P5 is connected at a gate to the power supply terminal. The PMOS transistor P6 is connected at a source to a drain of the PMOS transistor P9 and to a source of the PMOS transistor P8. The PMOS transistor P9 is connected at a source to the power supply terminal. The PMOS transistor P7 is connected at a gate to the power supply terminal.

The PMOS transistors P2, P5, P6, P7 and P8 are connected at substrate terminals to a node (NWELL) in a floating state, which are not connected to the power supply terminal. According to the function of the floating NWELL, no leak current is supplied from the output terminal OUT to the power supply terminal in the LSI, even if the external voltage Z applied at the output terminal OUT is larger than LSI power supply voltage VDD.

Figure 2:
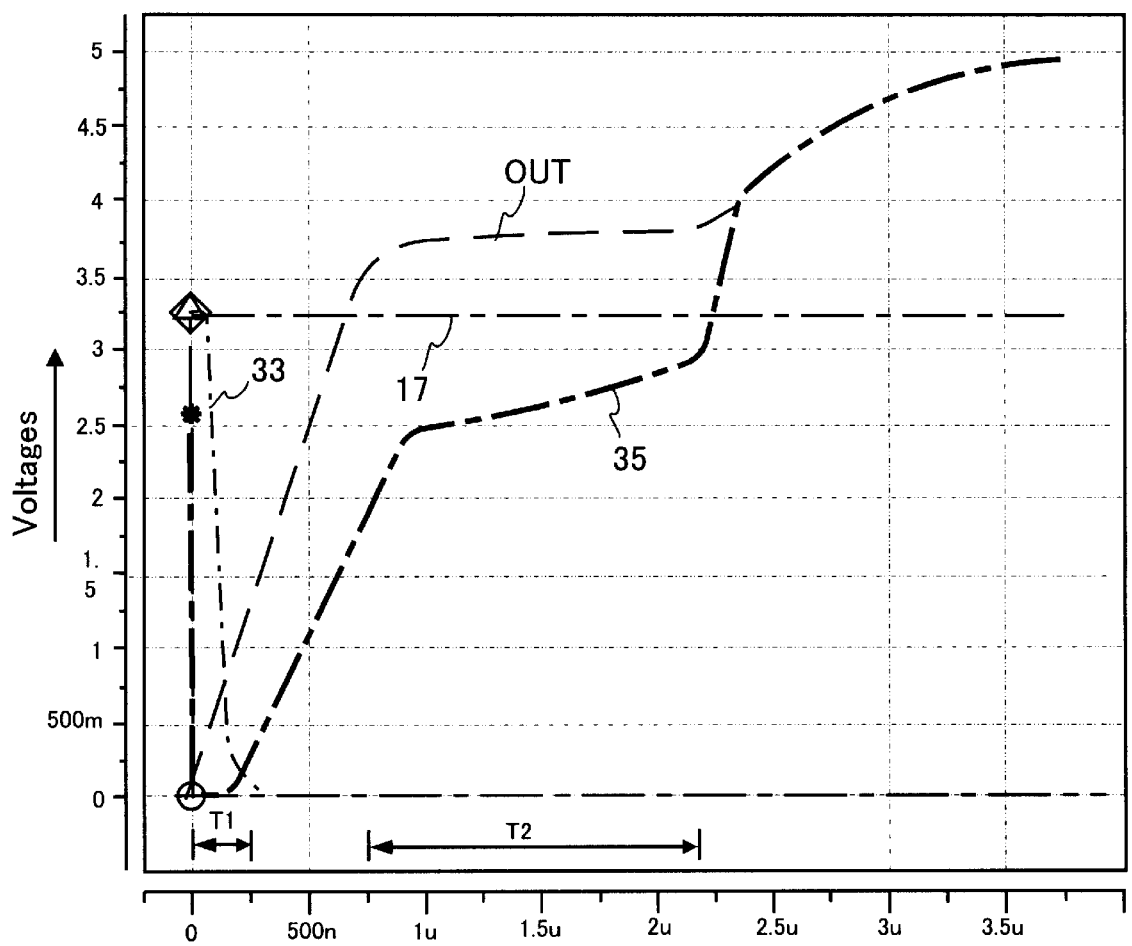
FIG. 2 is a graph showing the operation of the conventional tri-state output circuit, shown in FIG. 1, in the case where an output terminal is changed in voltage from "L" level to "Z" level that is higher than "H" level.
Figure 3:
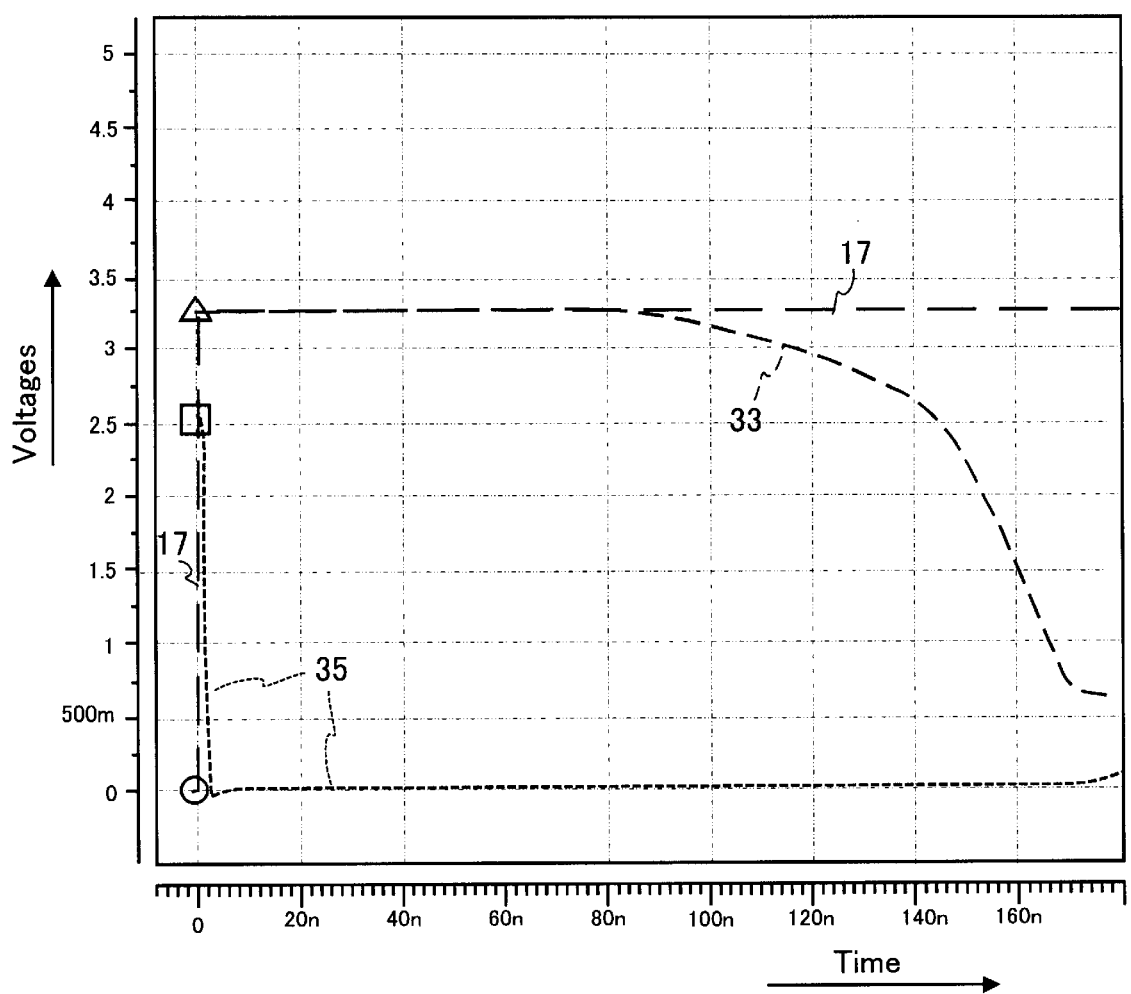
FIG. 3 is a graph enlarging a part of the graph, shown in FIG. 2.

FIG. 2 shows the operation of the tri-state output circuit shown in FIG. 1 in the case where the output logic at the output terminal OUT is changed "L" level (0 V) to "Z" level (5 V). The external voltage is applied to the output terminal OUT through a pull-up resistance, not shown. FIG. 3 is an enlarged graph showing the operation of the tri-state output circuit shown in FIG. 1 for a time At the beginning, the signal input terminal IN is at "L" level; enable signal input terminal EB is at "H" level; the output terminal OUT is at "L" level; node 32 is at VDD level; node 35 is at a level "VDD-Vtn"; node 14 is at VDD level; node 17 is at "L" level; and node 33 is at "H" level. When the enable signal input terminal EB is turned "H" to "L", the node 14 is turned "H" to "L" and the NMOS transistor N9 is turned off. As a result, the output logic becomes "Z". The voltage level at the output terminal OUT is increasing to an external pull-up voltage through the pull-up resistance.

In this operation, electrical current is supplied from the external power supply and flows through the pull-up resistance, output terminal OUT and the PMOS transistors P8 and P9 to the LSI power supply terminal. As a result, the output logic level is not changed for a time "T2" on the way to the external voltage level "Z".

In more detail, as shown in FIG. 3, when the node 17 is turned in level "L" to "H" and the NMOS transistor N2 is turned on, the node 35 is turned in level "VDD-Vtn" to "L". In this case, the PMOS transistor P8 is turned on and electrical current flows through the PMOS transistor P8 to the substrate terminal of the PMOS transistor P9. After that, when the output terminal OUT increases in voltage level and exceeds a sense level of the inverter INV5, the node 33 is turned to "L" and the NMOS transistor N3 is turned off. When the voltage level at the output terminal OUT further increases, the node 35 gets closer in level to the output terminal OUT (T2). Subsequently, when the voltage level at the node 35 becomes the same as the output terminal OUT, the PMOS transistor P8 is turned off; and therefore, the output terminal OUT is pulled up to the external voltage level "Z".

Figure 4:
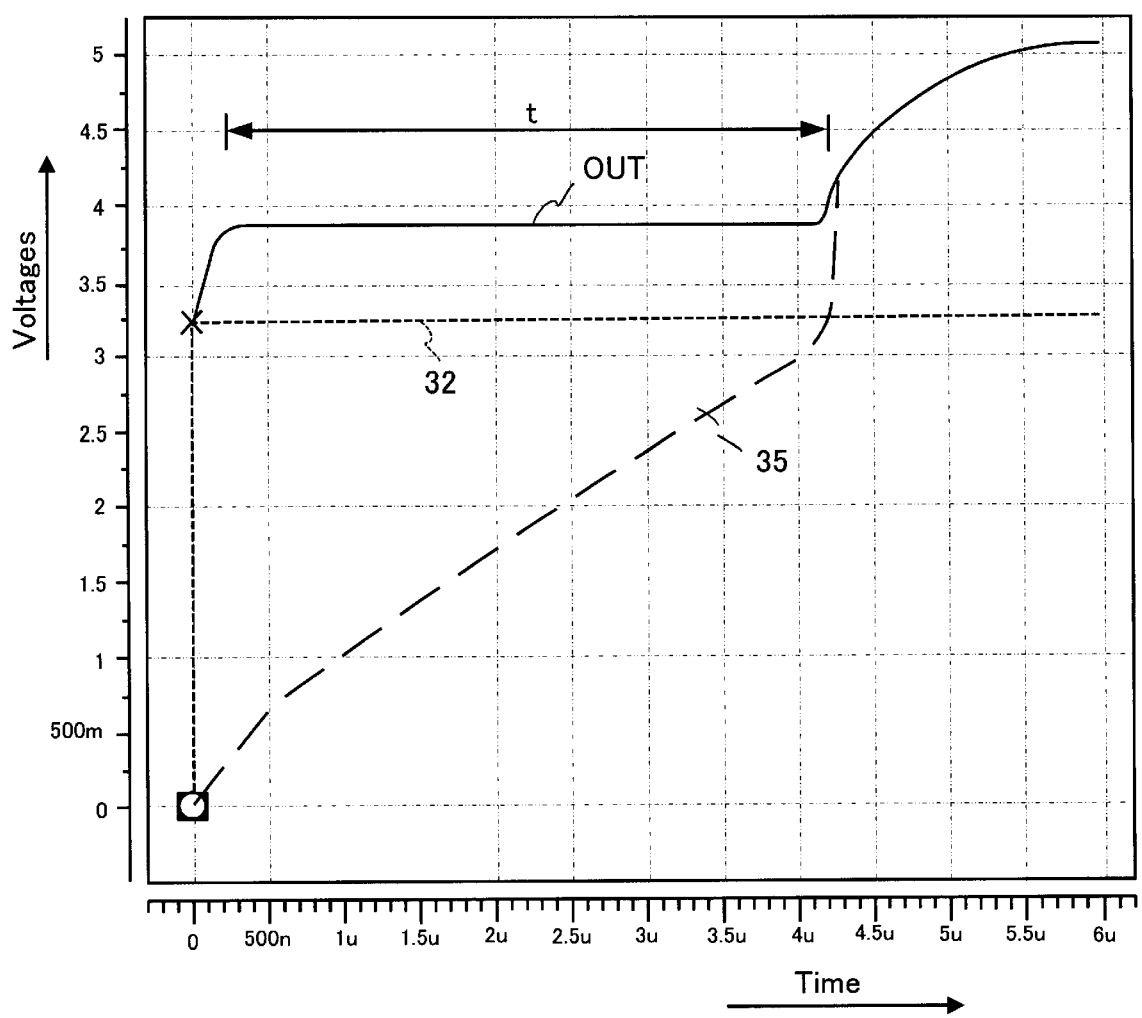
FIG. 4 is a graph showing the operation of the conventional tri-state output circuit, shown in FIG. 1, in the case where an output terminal is changed in voltage "H" level to "Z" level.

FIG. 4 shows the operation of the tri-state output circuit shown in FIG. 1 in the case where the output logic at the output terminal OUT changes "H" level (VDD=3 V) to "Z" level (5 V). The external supply voltage is applied to the output terminal OUT through a pull-up resistance, not shown. As shown in FIG. 4, the output logic level is not changed for a time "T" on the way to the external voltage level "Z" as well as the condition of FIG. 2. Therefore, the tri-state output circuit operates unstably.

At the beginning, the signal input terminal IN is at "H" level; enable signal input terminal EB is at "H" level; node 32 is at "L" level and node 35 is at "L" level. When the enable signal input terminal EB is turned in level "H" to "L", the node 32 is turned to "H", the NMOS transistor N1 is turned off, so that the node 35 does not is turned to "H" and the NMOS transistor N9 is turned off. As a result, the node 35 gets closer in level to the output terminal OUT (T2), and the PMOS transistor P8 is turned off when the node 35 becomes in level the same as the output terminal OUT. Consequently, the output terminal OUT is pulled up to the external voltage level "Z". However, a leak current is generated during the time "t".

As described above, the output logic level is not changed for a time "T2" on the way to the external voltage level "Z". Therefore, the tri-state output circuit operates unstably.

First Preferred Embodiment

Figure 5:
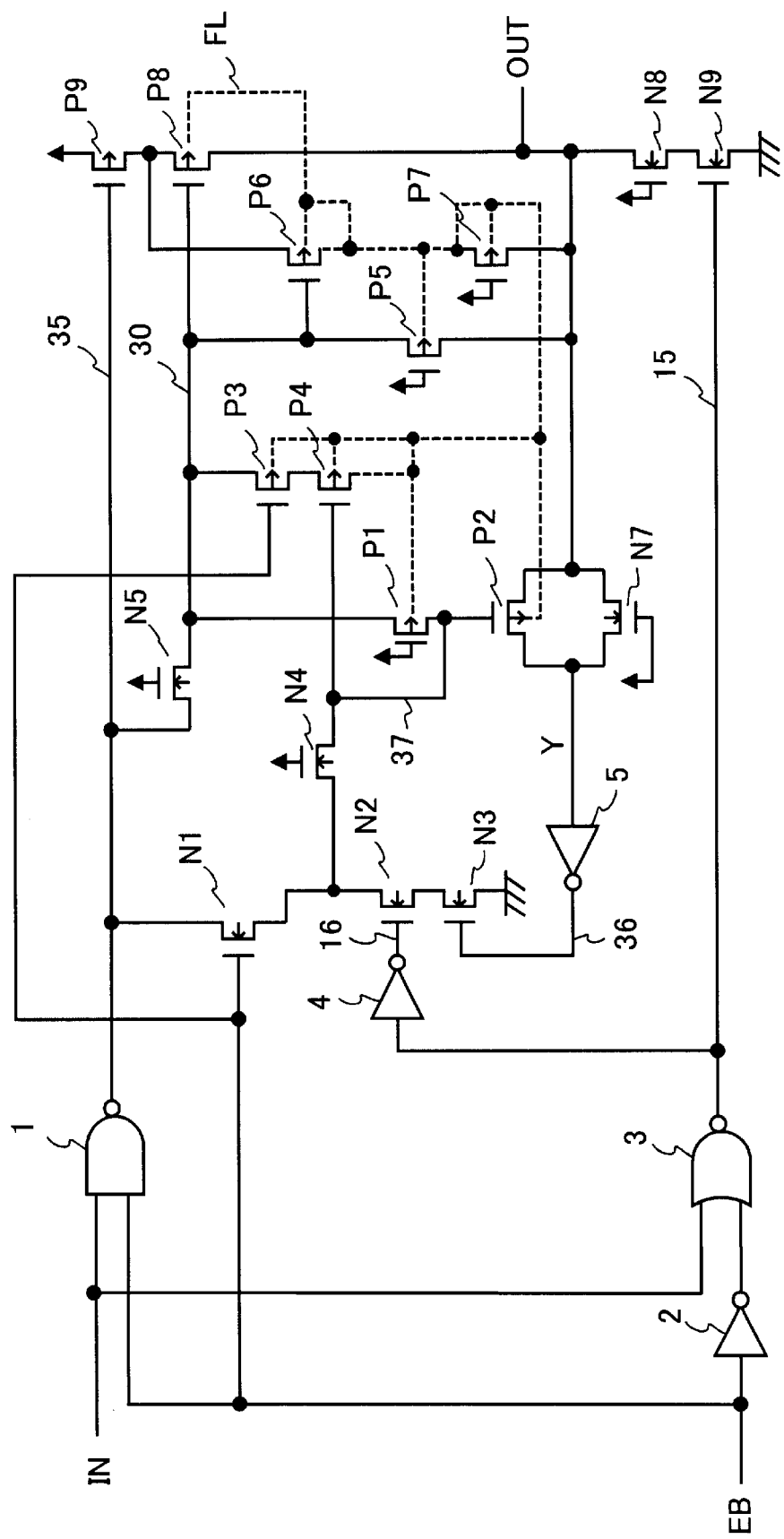
FIG. 5 is a block diagram illustrating a tri-state output circuit, used in a semiconductor integrated circuit, according to a first preferred embodiment of the present invention.

"FIG. 5 shows a tri-state output circuit according to a first preferred embodiment of the present invention. The output circuit includes a NAND gate 1; inverters 2, 4, and 5; a NOR gate 3, NMOS transistors N1, N2, N3, N4, N5, N6, N7, N8 and N9; and PMOS transistors P1, P2, P3, P4, P5, P6, P7, P8 and P9. The NAND circuit 1 has input terminals connected to a signal input terminal IN and to an enable signal input terminal (EB terminal) EB. The signal input terminal IN is also connected to an input terminal of the NOR circuit 3. The EB terminal is also connected to an input terminal of the inverter 2, a gate of the NMOS transistor N1 and to a gate of the PMOS transistor P3. The inverter 2 is connected at an output terminal to the other input terminal of the NOR circuit 3."

The NAND circuit 1 is connected at an output terminal to a node that is connected to a gate of the PMOS transistor P9, a drain of the NMOS transistor N1 and a drain of the NMOS transistor N5. The NMOS transistor N1 is connected at a gate to the EB terminal. The NOR gate 3 is connected at an output terminal to a node 15 that is connected to an input terminal of the inverter 4 and a gate of the NMOS transistor P9. The inverter 4 is connected at an output terminal to a node 16 connected to a gate of the NMOS transistor N2. The NMOS transistor N1 is connected at a source to drains of the NMOS transistors N2 and N4. The NMOS transistor N2 is connected at a source to a drain of the NMOS transistor N3. The NMOS transistor N3 is connected at a source to the ground and at a gate to a node 36 connected to an output terminal of the inverter 5.

The NMOS transistor N4 is connected at a gate to an internal power supply terminal (VDD) and at a source to a node 37 that is connected to a gate of the PMOS transistor P4, a drain of the PMOS transistor P1 and to a gate of the PMOS transistor P2. The NMOS transistor N5 is connected at a gate to the power supply terminal and at a source to a node 30 that is connected to a source of the PMOS transistor P1, a source of the PMOS transistor P3, a gate of the PMOS transistor P6, a source of the PMOS transistor P5 and to a gate of the PMOS transistor P8. The PMOS transistor P1 is connected at a gate to the power supply terminal. The PMOS transistor P3 is connected at a drain to a source of the PMOS transistor P4. The PMOS transistor P4 is connected at a drain to a node FL, which is in a floating state.

The inverter 5 is connected at an input terminal to sources of the PMOS transistor P2 and NMOS transistor N7. The NMOS transistor N7 is connected at a gate to the power supply terminal and at a drain to a drain of the PMOS transistor P2. The drains of the PMOS transistor P2 and NMOS transistor N7 are connected to an output terminal OUT, which is connected to drains of the PMOS transistors P5, P7 and P8 and NMOS transistor N8.

The NMOS transistor N8 is connected at a gate to the power supply terminal and at a source to a drain of the NMOS transistor N9. The NMOS transistor N9 is connected at a source to the ground. The PMOS transistor PS is connected at a gate to the power supply terminal. The PMOS transistor P6 is connected at a source to a drain of the PMOS transistor P9 and to a source of the PMOS transistor P8. A drain of the PMOS transistor P6 is connected to the node FL. The PMOS transistor P9 is connected at a source to the power supply terminal. The PMOS transistor P7 is connected at a gate to the power supply terminal.

The substrate terminals of the PMOS transistors P1, P2, P3, P4, P5, P6, P7 and P8 are connected to the node FL (NWELL) in a floating state, which are not connected to the power supply terminal (VDD). The output terminal OUT is connected to an external supply terminal, supplying a voltage "Z" that is higher than the internal supply voltage VDD, through a pull-up resistance. According to the function of the floating NWELL, no leak current is supplied from the output terminal OUT to the power supply terminal in the LSI.

Figure 7:
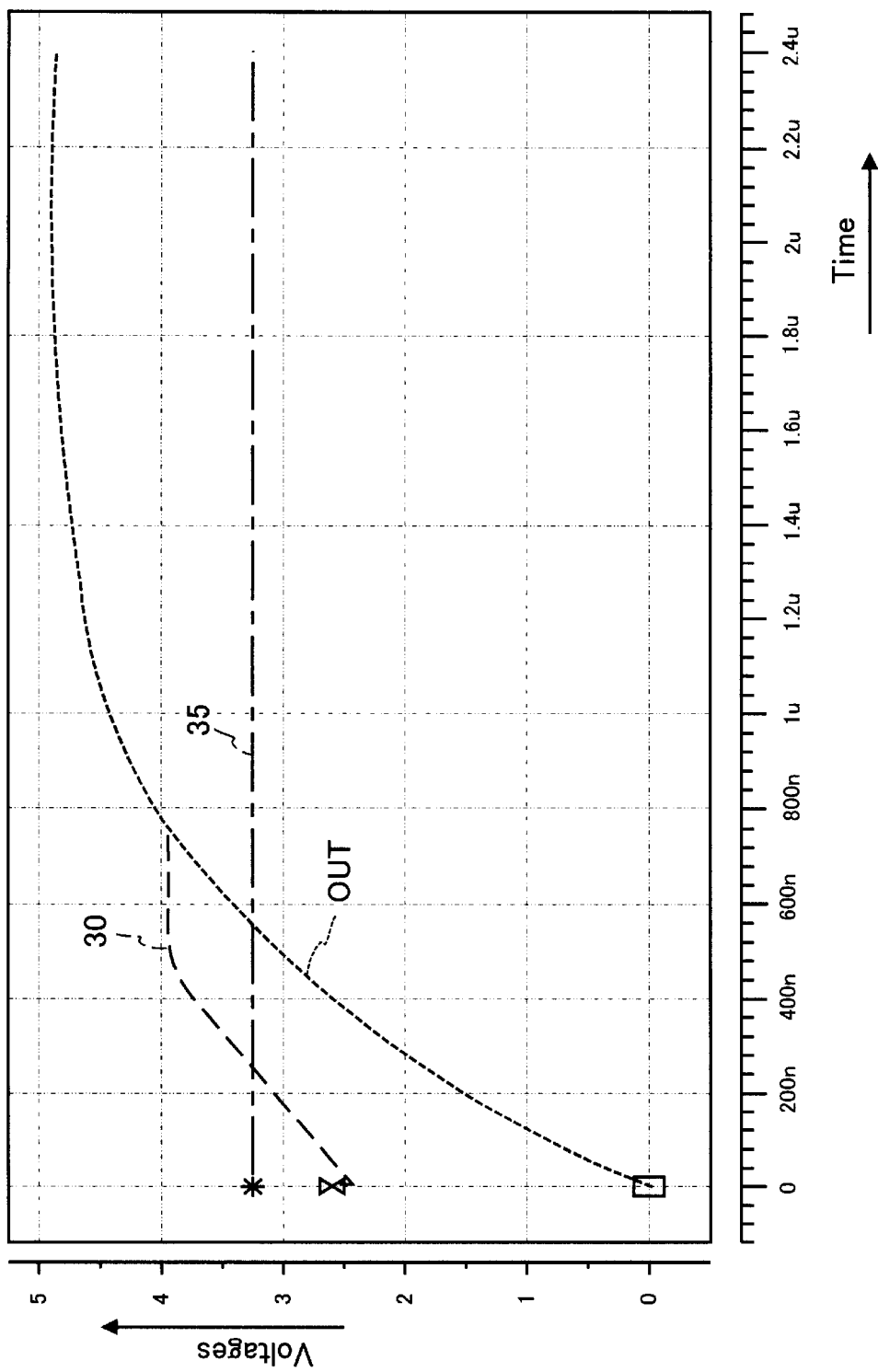
FIGS. 7–11 are graphs showing the operation of the first preferred embodiment, shown in FIG. 5.
Figure 8:
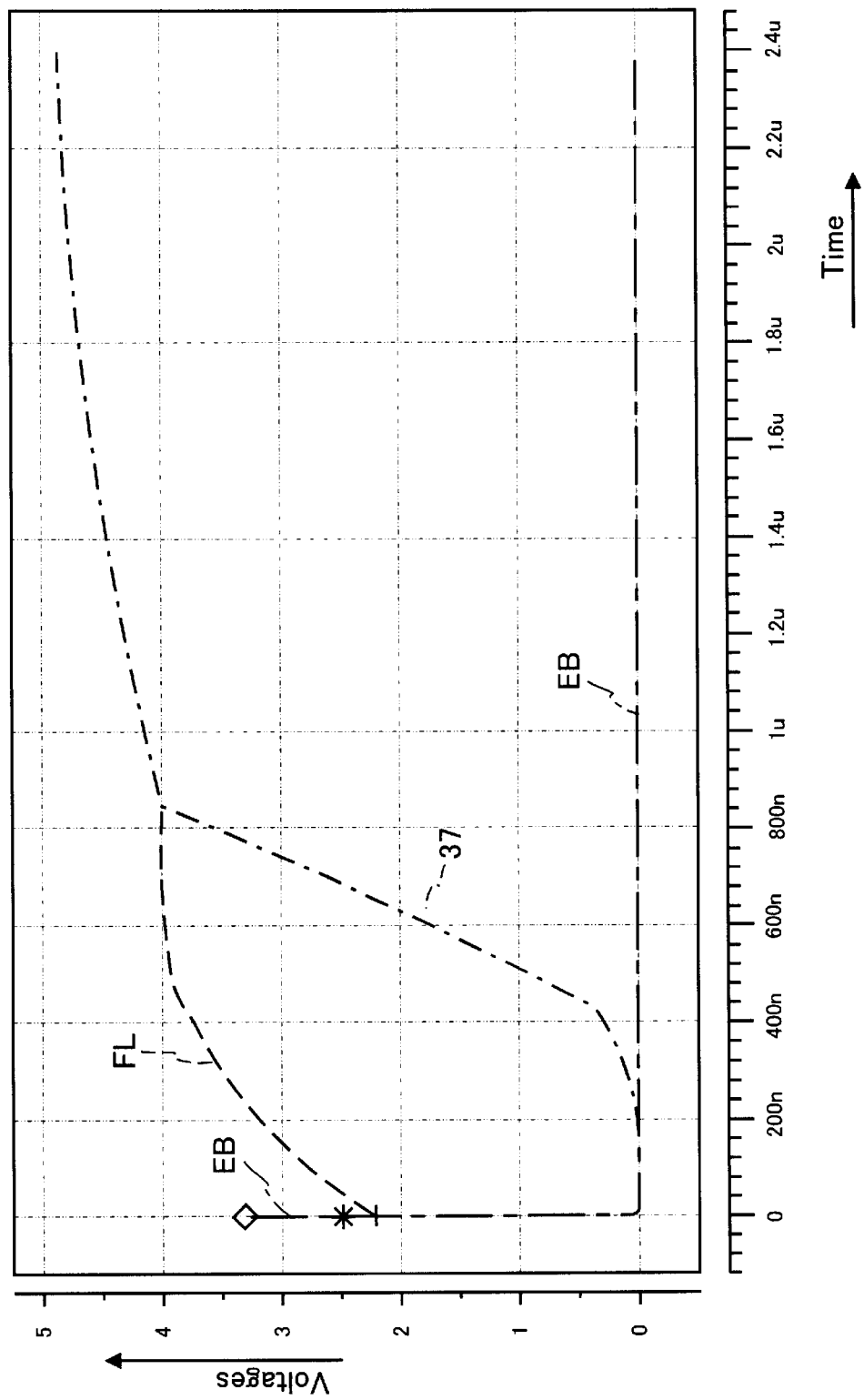
Figure 9:
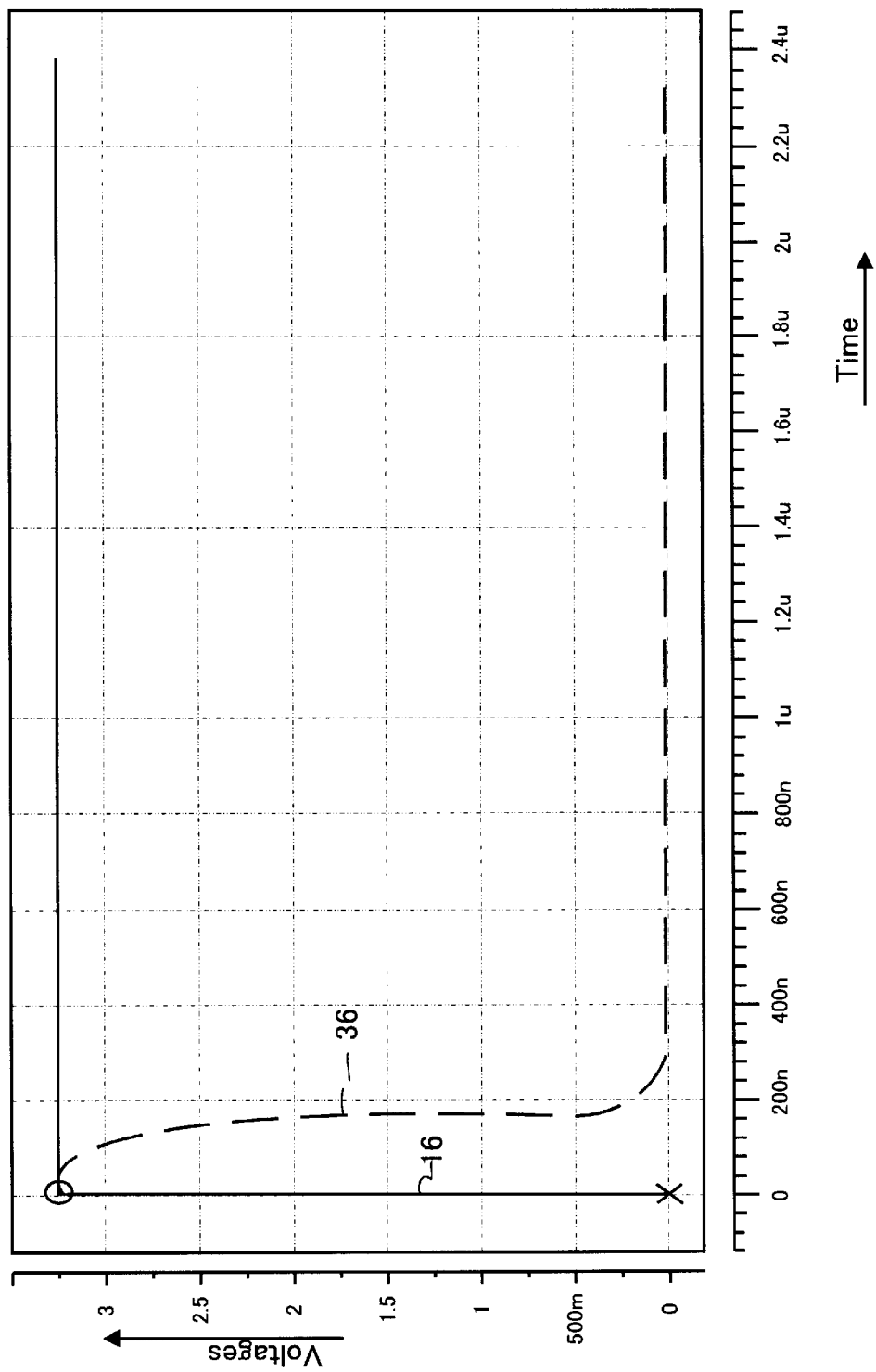

FIGS. 7 to 9 show the operation of the tri-state output circuit shown in FIG. 5 in the case where the level at the output terminal OUT is changed "L" level (0 V) to "Z" level (5 V). The external voltage is applied to the output terminal OUT through a pull-up resistance, not shown.

At the beginning, the signal input terminal IN is at "L " level; the enable signal input terminal EB is at "H" level; the output terminal OUT is at "L" level; the node 35 is at VDD level; the node 30 is at a level of "VDD-Vtn"; the node 15 is at VDD level; the node 37 is at a level of "VDD-Vtn"; the node 16 is at "L" level; and the node 36 is at VDD level. When the enable signal input terminal EB is turned "H" to "L", the node 15 is turned to "L"; node 16 is turned "L" to "H"; node 37 is turned "VDD-Vtn" to "L" and the NMOS transistors N2 and N3 are on, however, the node 30 is still at "VDD-Vtn" level. Accordingly, the NMOS transistor N8 is turned off, and the voltage level at the output terminal OUT is increased to an external pull-up voltage "Z".

Figure 10:
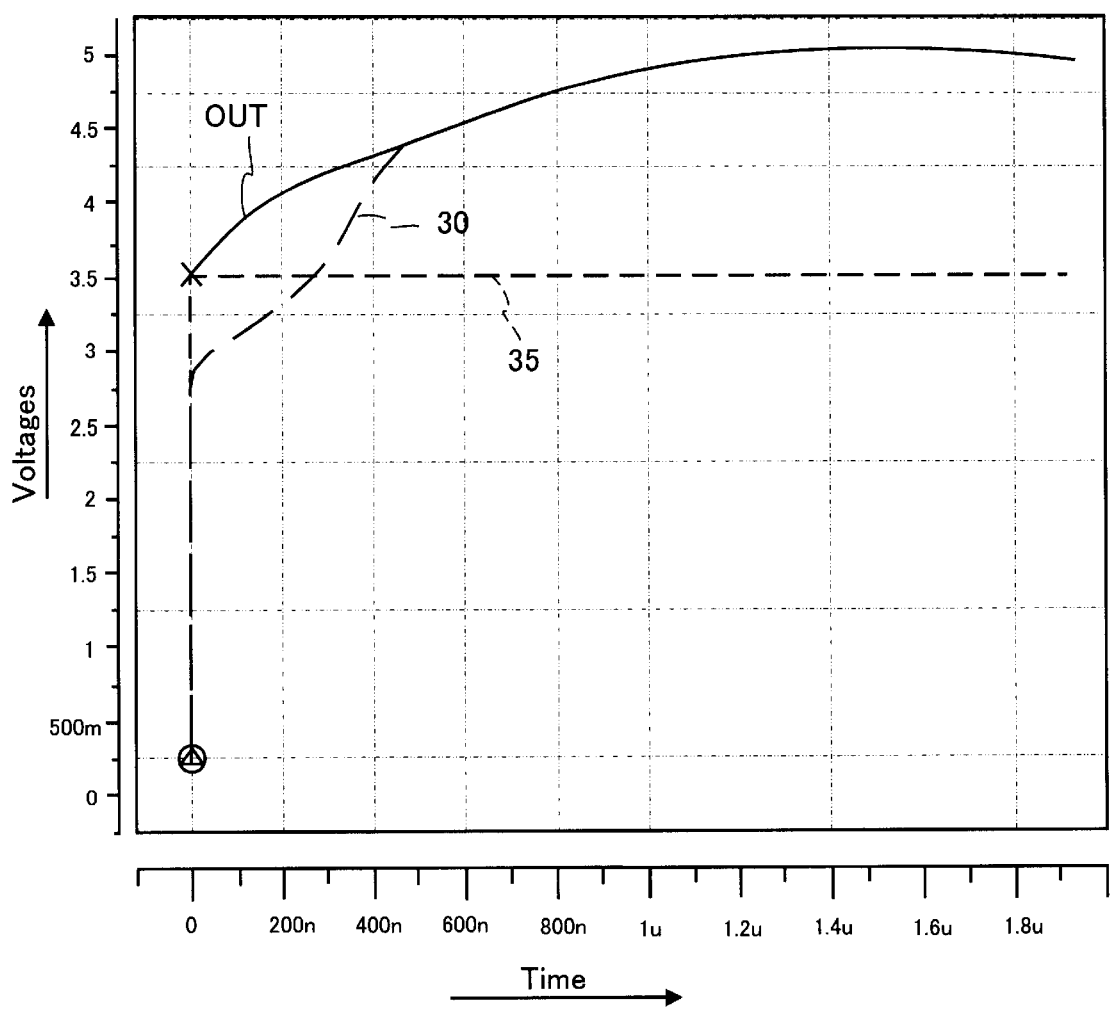
Figure 11:
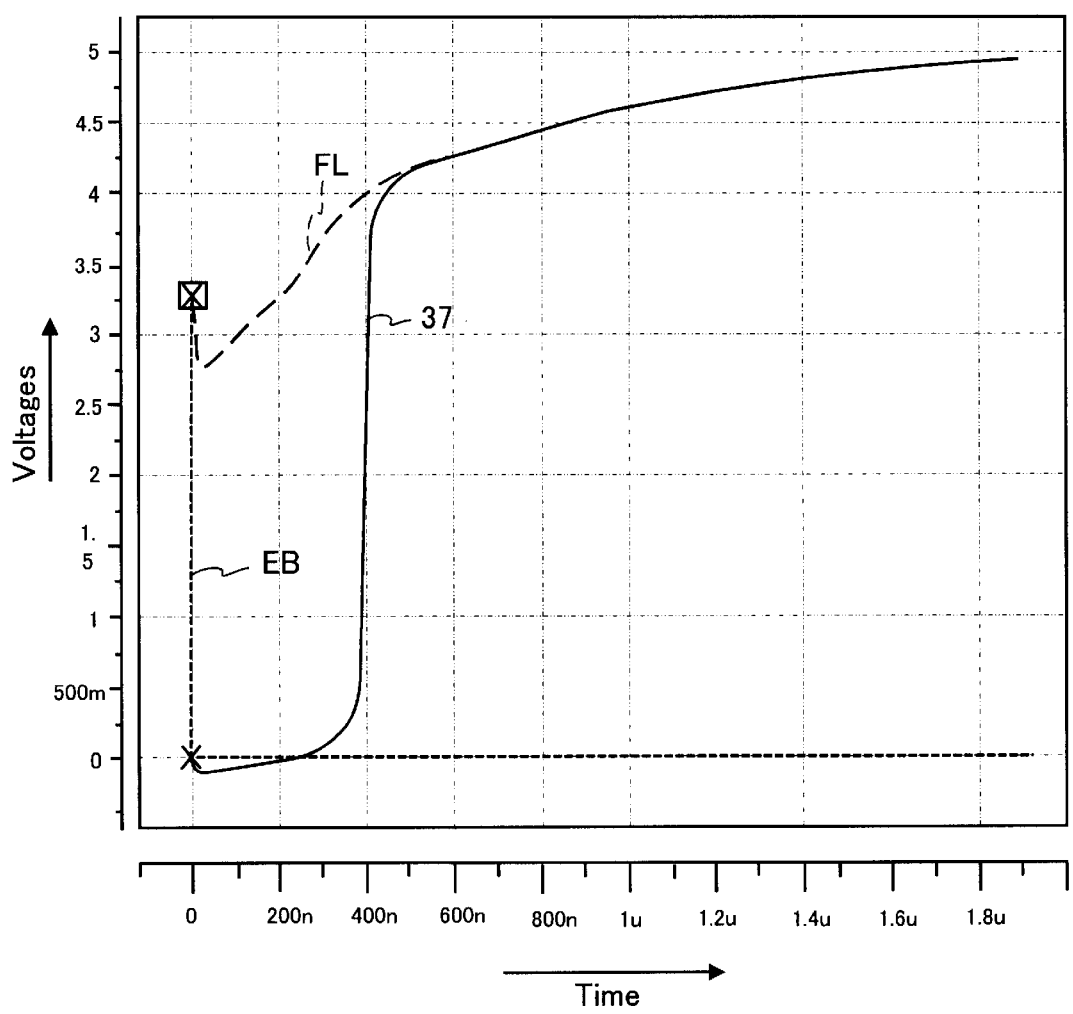

FIGS. 10 and 11 show the operation of the tri-state output circuit shown in FIG. 5 in the case where the output logic at the output terminal OUT is changed "H" level (VDD=3 V) to "Z" level (5 V). The external voltage is applied to the output terminal OUT through a pull-up resistance, not shown.

At the beginning, the signal input terminal IN is at "H" level; the enable signal input terminal EB is at "H" level; the nodes 35, 30 and 15 are at "L" level; and the output terminal OUT is at "H" level. In this state, the nodes 16 and 36 are at "H" level; the NMOS transistors N2 and N3 are on; and the node 37 is at "L" level. The NMOS transistor N1 is on. From that condition, when the enable signal input terminal EB is turned in level "H" to "L", the NMOS transistor N1 is turned off, the node 35 is turned to "H" and the PMOS transistor P3 is turned on. Therefore, the node 30 is turned to "VDD" level in accordance with the function of the node FL (floating NWELL). As a result, the PMOS transistor P8 is turned off, and the node FL becomes having the same level as the output terminal OUT when exceeding H level voltage VDD; and therefore, the output terminal OUT is pulled up to the external supply voltage (Z=5 V).

As described above, according to the first preferred embodiment, the PMOS transistor P8 is turned off immediately when the output logic level is changed "L" level to "Z" level. That is because, the output circuit includes the PMOS transistor P1 that is connected at a gate to the internal supply terminal (VDD) and at a substrate terminal to the node FL, which is in a floating state. Consequently, the output circuit operates stably.

Second Preferred Embodiment

Figure 6:
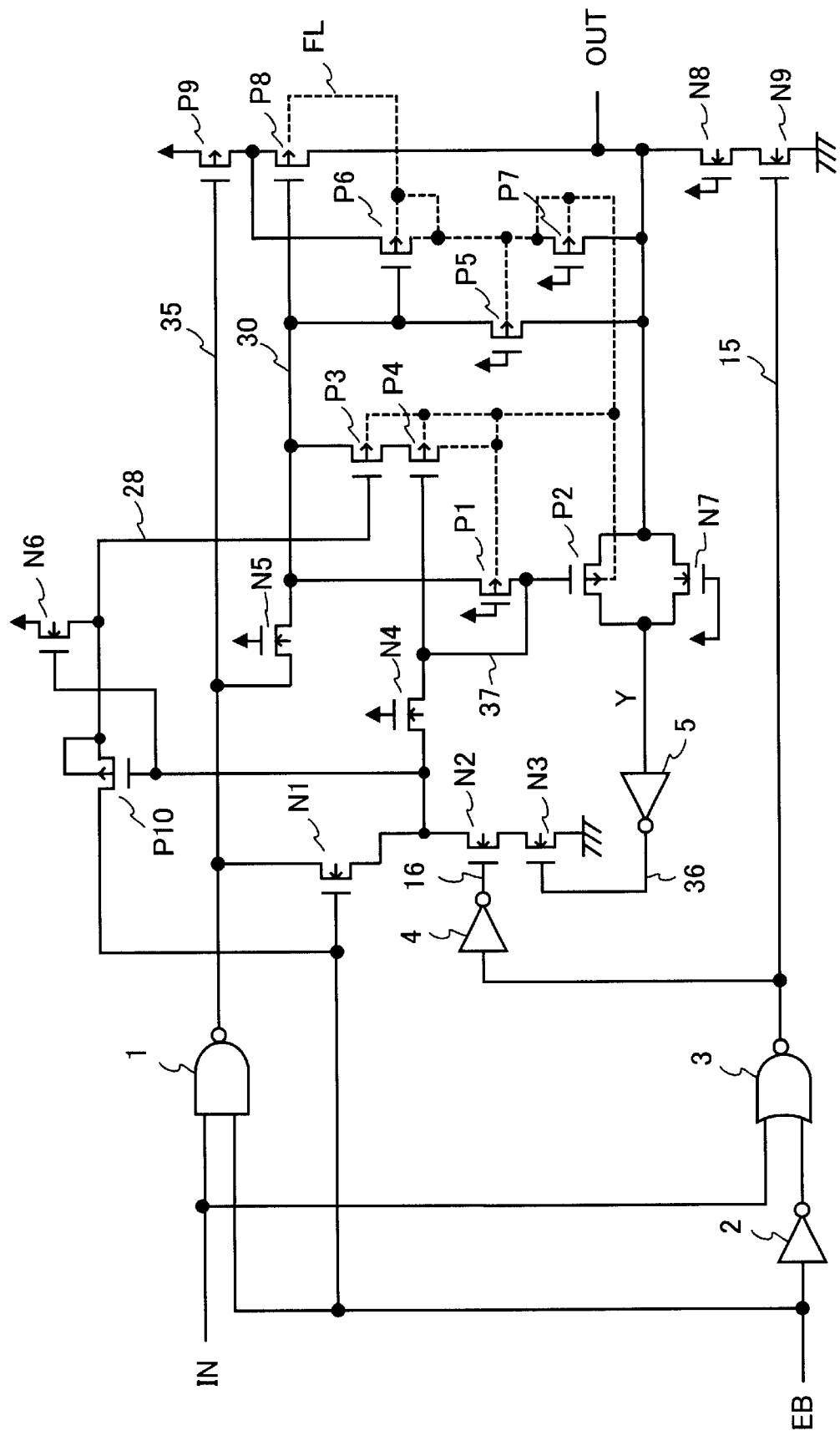
FIG. 6 is a block diagram illustrating a tri-state output circuit, used in a semiconductor integrated circuit, according to a second preferred embodiment of the present invention.

FIG. 6 shows a tri-state output circuit according to a second preferred embodiment of the present invention. In this embodiment, the same or corresponding components to the above-described first preferred embodiment are represented by the same reference numerals. The output circuit includes a NAND gate 1; inverters 2, 4 and 5; a NOR gate 3, NMOS transistors N1, N2, N3, N4, N5, N6, N7, N8 and N9; and PMOS transistors P1, P2, P3, P4, P5, P6, P7, P8, P9 and P10. The NAND circuit 1 has input terminals connected to a signal input terminal IN and to an enable signal input terminal (EB terminal) EB. The signal input terminal IN is also connected to an input terminal of the NOR circuit 3. The EB terminal is also connected to an input terminal of the inverter 2, a gate of the NMOS transistor N1 and to a drain of the PMOS transistor P10. The inverter 2 is connected at an output terminal the other input terminal of the NOR circuit 3.

The NAND circuit 1 is connected at an output terminal to a node 35 that is connected to a gate of the PMOS transistor P9, a drain of the NMOS transistor N1 and a drain of the NMOS transistor N5. The NMOS transistor N1 is connected at a gate to the EB terminal. The NOR gate 3 is connected at an output terminal to a node 15 that is connected to an input terminal of the inverter 4 and a gate of the NMOS transistor P9. The inverter 4 is connected at an output terminal to a node 16 connected to a gate of the NMOS transistor N2. The NMOS transistor N1 is connected at a source to drains of the NMOS transistors N2 and N4 and a node 5. The node 5 is connected to gates of the PMOS transistor P10 and NMOS transistor N6. The NMOS transistor N2 is connected at a source to a drain of the NMOS transistor N3. The NMOS transistor N3 is connected at a source to the ground and at a gate to a node 36 connected to an output terminal of the inverter 5.

The PMOS transistor P10 is connected at a source to its substrate and to a node 28, connected to a source of the NMOS transistor N6 and a gate of the PMOS transistor P3. The NMOS transistor N6 is connected at a drain to the power supply terminal.

The NMOS transistor N4 is connected at a gate to a power supply terminal and at a source to a node 37 that is connected to a gate of the PMOS transistor P4, a drain of the PMOS transistor P1 and to a gate of the PMOS transistor P2. The NMOS transistor N5 is connected at a gate to the power supply terminal and at a source to a node 30 that is connected to a source of the PMOS transistor P1, a source of the PMOS transistor P3, a gate of the PMOS transistor P6, a source of the PMOS transistor P5 and to a gate of the PMOS transistor P8. The PMOS transistor P1 is connected at a gate to the power supply terminal. The PMOS transistor P3 is connected at a drain to a source of the PMOS transistor P4.

The inverter 5 is connected at an input terminal to sources of the PMOS transistor P2 and NMOS transistor N7. The NMOS transistor N7 is connected at a gate to the power supply terminal and at a drain to a drain of the PMOS transistor P2. The drains of the PMOS transistor P2 and NMOS transistor N7 are connected to an output terminal OUT, which is connected to drains of the PMOS transistors P5, P7 and P8 and NMOS transistor N8.

The NMOS transistor N8 is connected at a gate to the power supply terminal and at a source to a drain of the NMOS transistor N9. The NMOS transistor N9 is connected at a source to the ground. The PMOS transistor P5 is connected at a gate to the power supply terminal. The PMOS transistor P6 is connected at a source to a drain of the PMOS transistor P9 and to a source of the PMOS transistor P8. The PMOS transistor P9 is connected at a source to the power supply terminal. The PMOS transistor P7 is connected at a gate to the power supply terminal.

Substrate terminals of the PMOS transistors P1, P2, P3, P4, P5, P6, P7 and P8 are connected to the node FL (NWELL) in a floating state, which are not connected to the power supply terminal. The output terminal OUT is connected to an external supply terminal, supplying a voltage "Z" that is higher than the internal supply voltage VDD, through a pull-up resistance. According to the function of the floating NWELL, no leak current is supplied from the output terminal OUT to the power supply terminal in the LSI.

Figure 12:
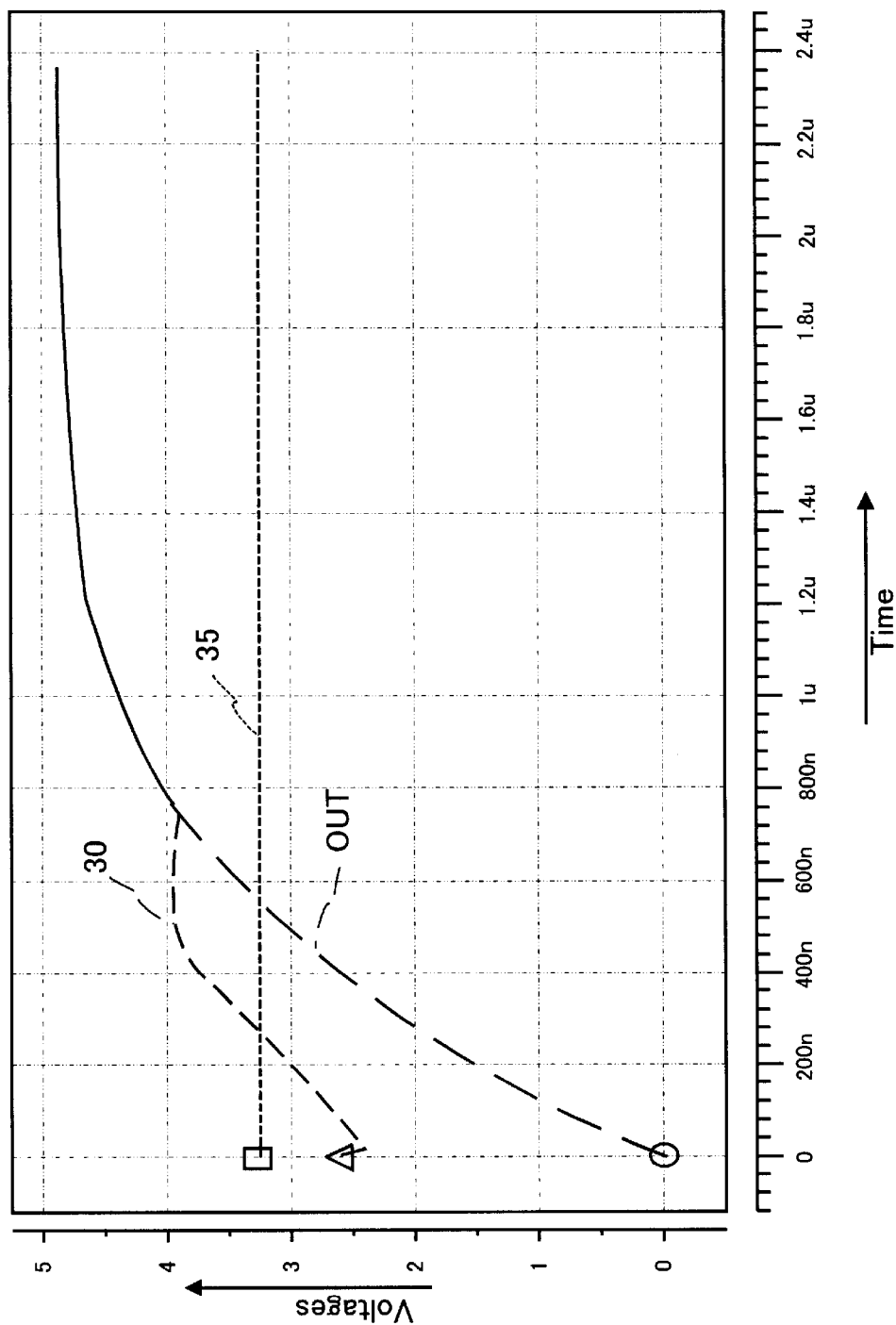
FIGS. 12–16 are graphs showing the operation of the first preferred embodiment, shown in FIG. 6.
Figure 13:
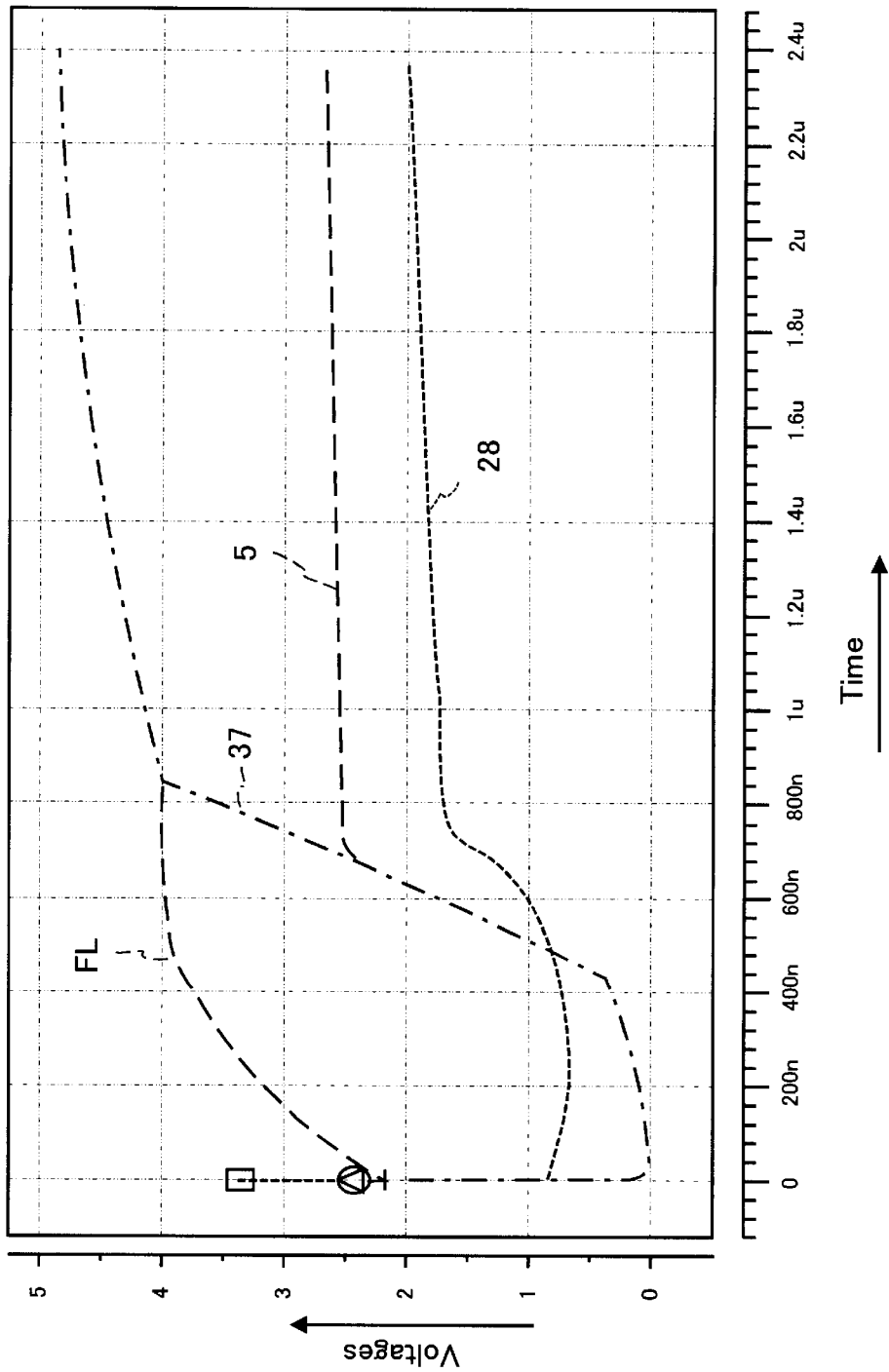
Figure 14:
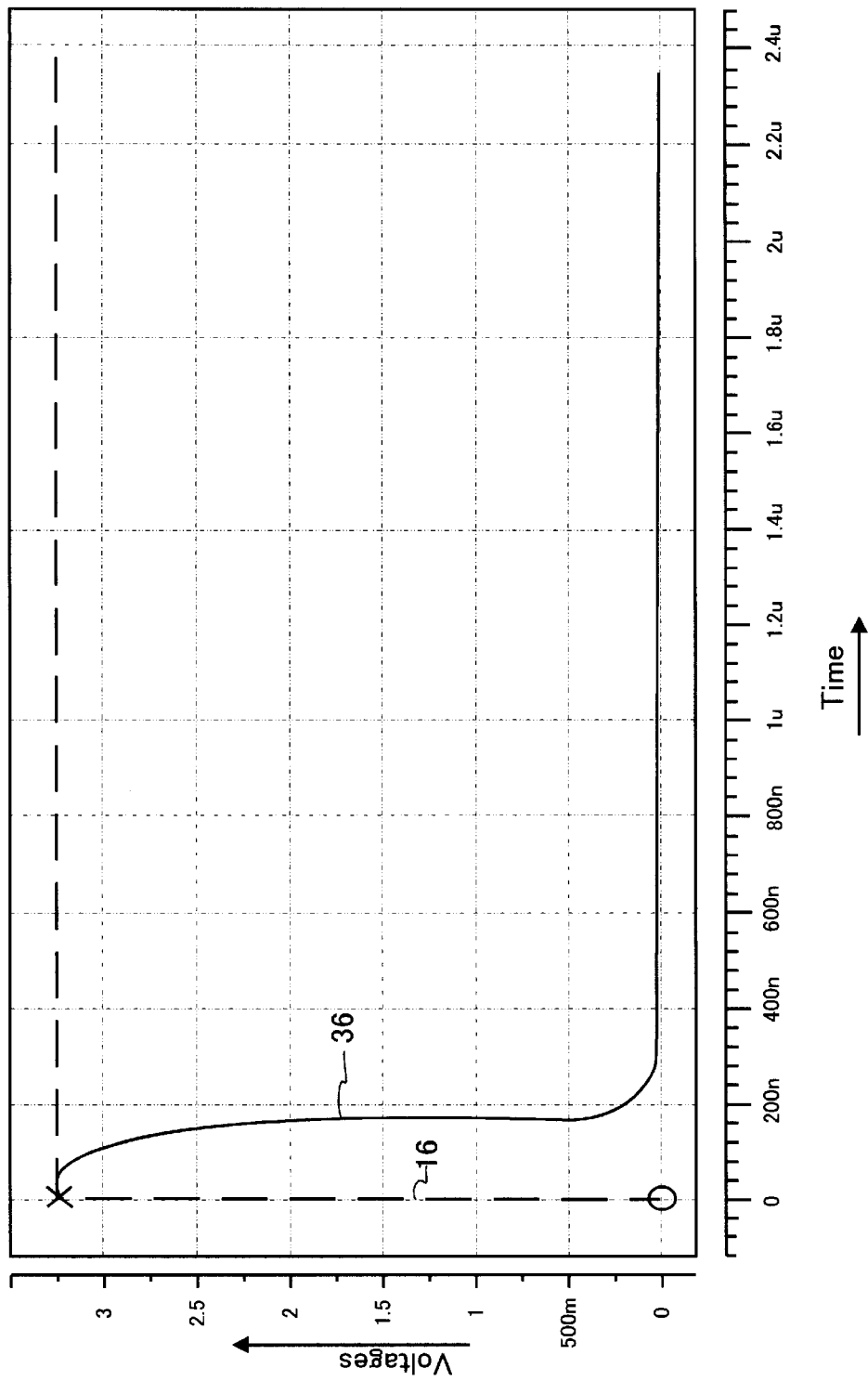

FIGS. 12 to 14 show the operation of the tri-state output circuit shown in FIG. 6 in the case where the level at the output terminal OUT is changed "L" level (0 V) to "Z" level (5 V). The external supply voltage is applied to the output terminal OUT through a pull-up resistance, not shown.

At the beginning, the signal input terminal IN is at "L" level; the enable signal input terminal EB is at "H" level; the output terminal OUT is at "L" level; the node 35 is at VDD level; the node 30 is at a level of "VDD-Vtn"; the node 15 is at VDD level; the node 37 is at a level of "VDD-Vtn"; the node 16 is at "L" level; and the node 36 is at VDD level. When the enable signal input terminal EB is turned in level "H" to "L", the node 15 is turned to "L"; node 16 is turned "L" to "H"; node 37 is turned "VDD-Vtn" to "L" and NMOS transistors N2 and N3 are on, however, the node 30 is still at "VDD-Vtn" level.

After that, when the output terminal OUT is changed to VDD, the node 36 is turned "H" to "L" and the NMOS transistor N3 is turned off. When the output terminal OUT is at VDD level, the node 30 is higher than VDD, so that the PMOS transistor P8 is off. After that, the output terminal OUT is increased to the external supply voltage, which is higher than the internal supply voltage VDD. In this case, the node 5 is at "VDD-Vtn" and the node 28 is at "VDD-2Vtn". The source and substrate terminal of the PMOS transistor P10 are at a lower voltage than the node 5, therefore, the PMOS transistor P10 is turned off and no electrical current flows through the NMOS transistor N6, PMOS transistor P10 and enable signal input terminal EB.

Figure 15:
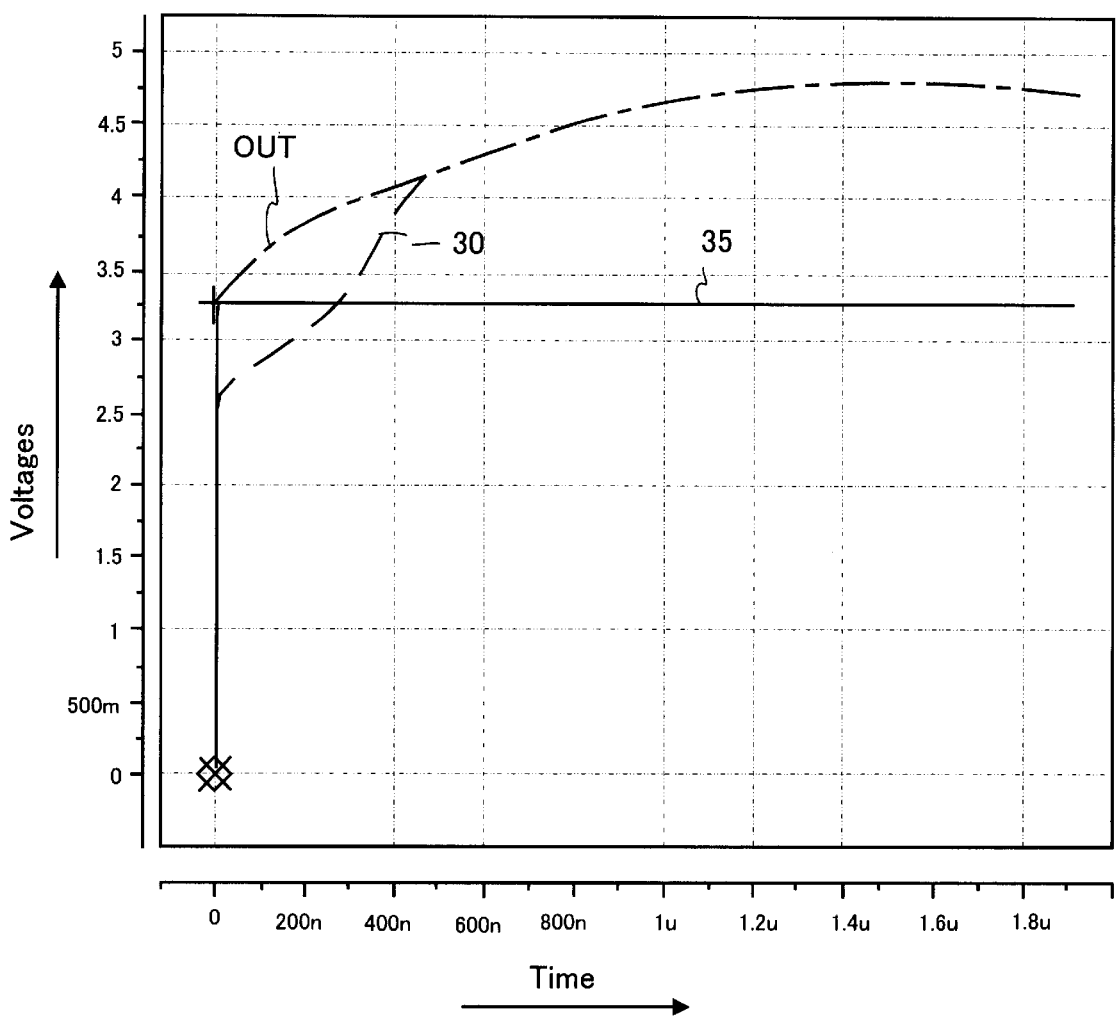
Figure 16:
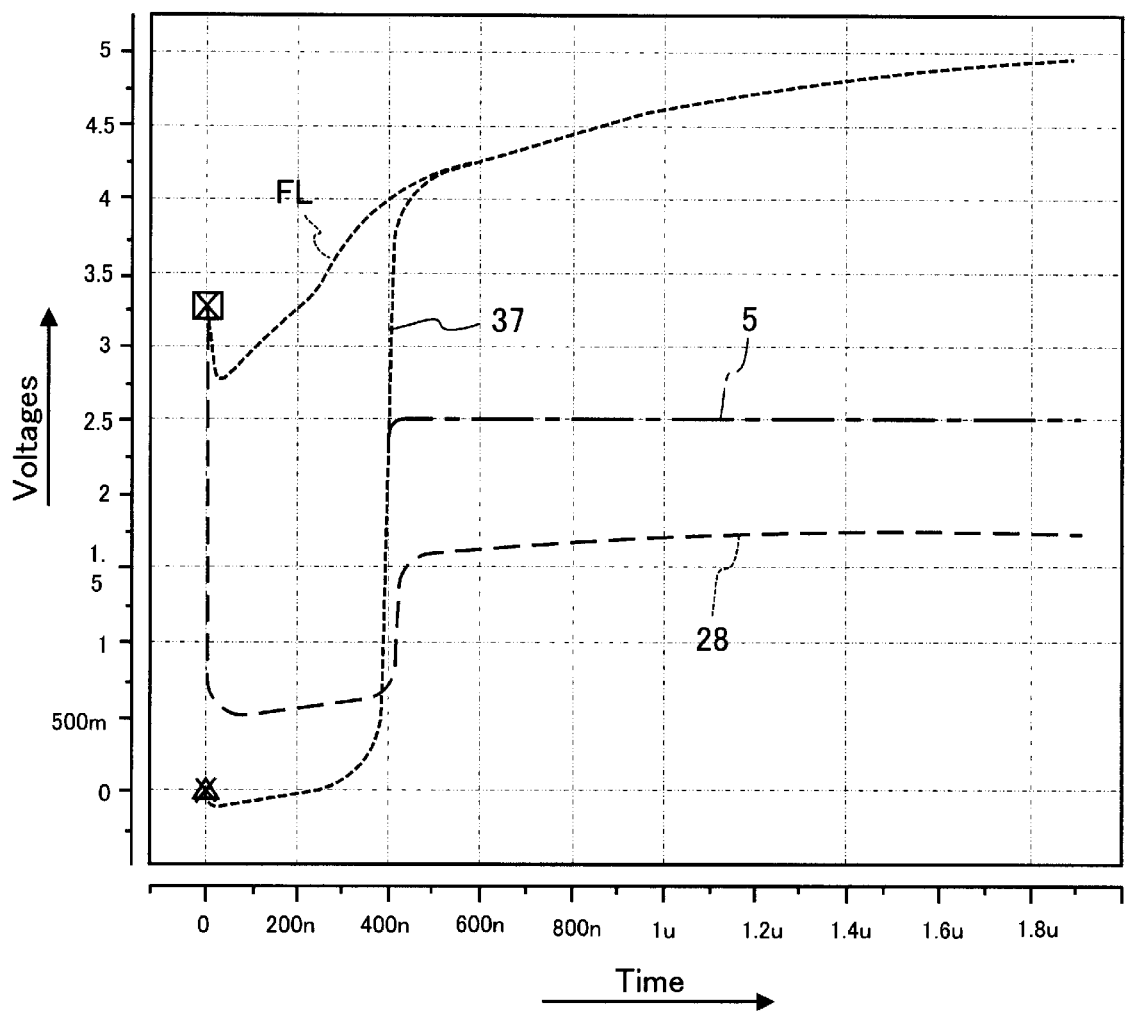

FIGS. 15 and 16 show the operation of the tri-state output circuit shown in FIG. 6 in the case where the output logic at the output terminal OUT is changed "H" level (VDD=3 V) to "Z" level (5 V). The external supply voltage is applied to the output terminal OUT through a pull-up resistance, not shown.

At the beginning, the signal input terminal IN is at "H" level; the enable signal input terminal EB is at "H" level; the nodes 35, 30 and 15 are at "L" level; and the output terminal OUT is at "H" level (=VDD). In this state, the nodes 16 and 36 are at "H" level; the NMOS transistors N2 and N3 are on; and the node 37 is at "L" level. The NMOS transistor N1 is on. From that condition, when the enable signal input terminal EB is turned "H" to "L", the NMOS transistor N1 is turned off, the node 35 is turned to "H" and the PMOS transistor P3 is turned on. Therefore, the node 30 is turned to "VDD" level in accordance with the function of the node FL (floating NWELL). As a result, the PMOS transistor P8 is turned off, and the node FL becomes the same level as the output terminal OUT when exceeding H level voltage VDD; and therefore, the output terminal OUT is pulled up to the external supply voltage (Z=5 V) immediately.

In this case, the node 5 is at "VDD-Vtn" and the node 28 is at "VDD-2Vtn". The source and substrate terminal of the PMOS transistor P10 are at a lower voltage than the node 5, therefore, the PMOS transistor P10 is turned off and no electrical current flows through the NMOS transistor N6, PMOS transistor P10 and enable signal input terminal EB.

As described above, according to the second preferred embodiment, the PMOS transistor P8 is turned off immediately when the output logic level is changed to "Z" level. That is because; the output circuit includes the PMOS transistor P1 that is connected at a gate to the internal supply terminal (VDD) and at a substrate terminal to the node FL, which is in a floating state. Consequently, the output circuit operates stably.

In addition, the node 28 is at a level of "VDD-2Vtn" and the potential difference between the node 28 and the node 30 is about 3 V. Therefore, the second preferred embodiment is useful for an output circuit in which MOS transistors may be damaged when a voltage of 5 V is made among the terminals (gate-drain-source).

Third Preferred Embodiment

Figure 17:
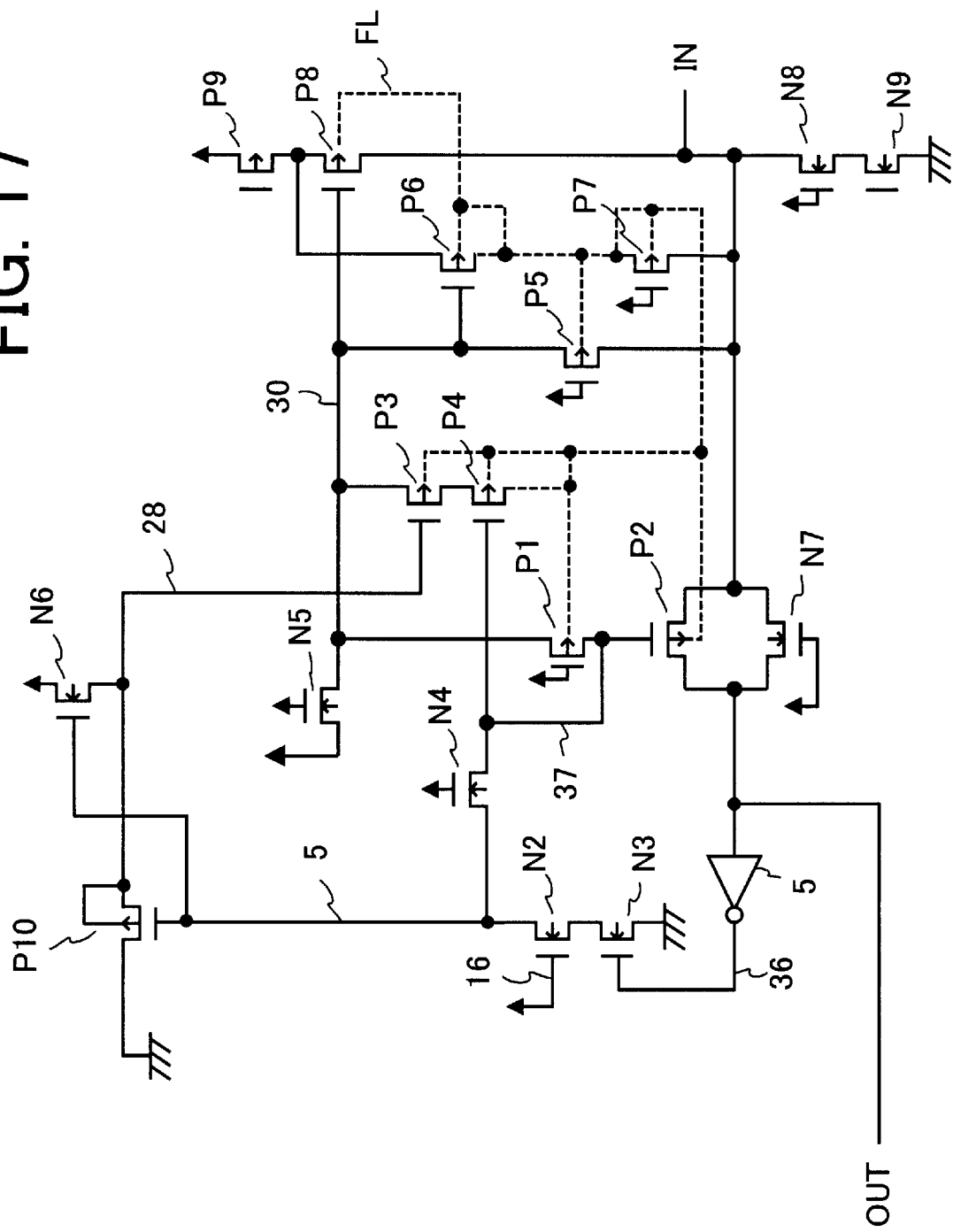
FIG. 17 is a block diagram illustrating an input circuit, used in a semiconductor integrated circuit, according to a third preferred embodiment of the present invention.

FIG. 17 shows an input circuit according to a third preferred embodiment of the present invention. In this embodiment, the same or corresponding components to the above-described embodiments are represented by the same reference numerals. The input circuit includes an inverter 5; NMOS transistors N2, N3, N4, N5, N6, N7, N8 and N9; and PMOS transistors P1, P2, P3, P4, P5, P6, P7, P8, P9 and P10. An output terminal OUT is connected to an input terminal of the inverter 5 and to sources of the PMOS transistor P2 and NMOS transistor N7.

The NMOS transistor N2 is connected at a gate to the internal power supply terminal (VDD), at a drain to a node 5 and at a source to a drain of the NMOS transistor N3. The NMOS transistor N3 is connected at a gate to a node 36 connected to an output term of the inverter 5 and at a source to the ground. The node 5 is connected to gates of the PMOS transistor P10 and NMOS transistor N6.

The PMOS transistor P10 is connected at a source to its substrate and to a node 28, connected to a source of the NMOS transistor N6 and a gate of the PMOS transistor P3. The NMOS transistor N6 is connected at a drain to the power supply terminal.

The NMOS transistor N4 is connected at a gate to a power supply terminal and at a source to a node 37 connected to a gate of the PMOS transistor P4, a drain of the PMOS transistor P1 and to a gate of the PMOS transistor P2. The NMOS transistor N5 is connected at gate and drain both to the power supply terminal and at a source to a node 30 connected to a source of the PMOS transistor P1, a source of the PMOS transistor P3, a gate of the PMOS transistor P6, a source of the PMOS transistor P5 and to a gate of the PMOS transistor P8. The PMOS transistor P1 is connected at a gate to the power supply terminal. The PMOS transistor P3 is connected at a drain to a source of the PMOS transistor P4.

The inverter 5 is connected at an input terminal to sources of the PMOS transistor P2 and NMOS transistor N7. The NMOS transistor N7 is connected at a gate to the power supply terminal and at a drain to a drain of the PMOS transistor P2. The drains of the PMOS transistor P2 and NMOS transistor N7 are connected to a signal input terminal IN, which is connected to drains of the PMOS transistors P5, P7 and P8 and NMOS transistor N8.

The NMOS transistor N8 is connected at a gate to the power supply terminal and at a source to a drain of the NMOS transistor N9. The NMOS transistor N9 is connected at a source to the ground. The PMOS transistor PS is connected at a gate to the power supply terminal. The PMOS transistor P6 is connected at a source to a drain of the PMOS transistor P9 and to a source of the PMOS transistor P8. The PMOS transistor P9 is connected at a source to the power supply terminal. The PMOS transistor P7 is connected at a gate to the power supply terminal.

The PMOS transistors P1, P2, P3, P4, P5, P6, P7 and P8 are connected at substrate terminals to a node FL (NWELL) in a floating state, which are not connected to the power supply terminal.

When the output circuits according to the first and second preferred embodiments, shown in FIGS. 5 and 6, are used as input-output circuits, an input terminal of an input circuit is connected to a node "Y".

What is claimed is:

1. An output circuit, comprising:
   an output terminal connected to an external circuit;
   an internal power supply terminal;
   a first node in a floating state;
   a second node;
   a third node;
   a first MOS transistor having a first terminal connected to the internal power supply terminal, a second terminal connected to the output terminal, a gate connected to the second node and a substrate terminal connected to the first node; and
   a second MOS transistor having a gate connected to the internal power supply terminal, a first terminal connected to the second node, a second terminal connected to the third node and a substrate terminal connected to the first node.

2. An output circuit according to claim 1, further comprising:

a third MOS transistor having a gate connected to the third node, a first terminal connected to the output terminal and a substrate terminal connected to the first node.

3. An output circuit according to claim 1, further comprising:

a fourth MOS transistor having a gate connected to the internal power supply terminal, a first terminal connected to the second node, a second terminal connected to the output terminal and a substrate terminal connected to the first node.

4. An output circuit according to claim 1, further comprising:

a fifth MOS transistor having a gate connected to the second node, a first terminal connected to the first terminal of the first MOS transistor, a second terminal connected to the first node and a substrate terminal connected to the first node.

5. An output circuit according to claim 1, further comprising:

a sixth MOS transistor having a gate connected to the internal power supply terminal, a first terminal connected to the first node, a second terminal connected to the output terminal and a substrate terminal connected to the first node.

6. An output circuit, comprising:

an output terminal connected to an external circuit;

an internal power supply terminal;

a first node in a floating state;

a second node;

a third node;

a first MOS transistor having a first terminal connected to the internal power supply terminal, a second terminal connected to the output terminal, a gate connected to the second node and a substrate terminal connected to the first node;

a second MOS transistor having a gate connected to the internal power supply terminal, a first terminal connected to the second node, a second terminal connected to the third node and a substrate terminal connected to the first node;

a third MOS transistor having a gate connected to the third node, a first terminal connected to the output terminal and a substrate terminal connected to the first node;

a fourth MOS transistor having a gate connected to the internal power supply terminal, a first terminal connected to the second node, a second terminal connected to the output terminal and a substrate terminal connected to the first node;

a fifth MOS transistor having a gate connected to the second node, a first terminal connected to the first terminal of the first MOS transistor, a second terminal connected to the first node and a substrate terminal connected to the first node; and a sixth MOS transistor having a gate connected to the internal power supply terminal, a first terminal connected to the first node, a second terminal connected to the output terminal and a substrate terminal connected to the first node.

7. An output circuit, comprising:

an output terminal connected to an external circuit;

an internal power supply terminal;

a first node in a floating state;

a second node;

a third node;

a first MOS transistor having a first terminal connected to the internal power supply terminal, a second terminal connected to the output terminal, a gate connected to the second node and a substrate terminal connected to the first node;

a third MOS transistor having a gate connected to the third node, a first terminal connected to the output terminal and a substrate terminal connected to the first node;

a seventh MOS transistor having a first terminal connected to the second node, a second terminal and a substrate terminal connected to the first node; and an eighth MOS transistor having a gate connected to the third node, a first terminal connected to the second terminal of the seventh MOS transistor, a second terminal connected to the first node and a substrate terminal connected to the first node.

8. An output circuit according to claim 7, further comprising:

a fourth MOS transistor having a gate connected to the internal power supply terminal, a first terminal connected to the second node, a second terminal connected to the output terminal and a substrate terminal connected to the first node.

9. An output circuit according to claim 7, further comprising:

a fifth MOS transistor having a gate connected to the second node, a first terminal connected to the first terminal of the first MOS transistor, a second terminal connected to the first node and a substrate terminal connected to the first node.

10. An output circuit according to claim 7, further comprising:

a sixth MOS transistor having a gate connected to the internal power supply terminal, a first terminal connected to the first node, a second terminal connected to the output terminal and a substrate terminal connected to the first node.

11. An output circuit, comprising:

an output terminal connected to an external circuit;

an internal power supply terminal;

a first node in a floating state;

a second node;

a third node;

a first MOS transistor having a first terminal connected to the internal power supply terminal, a second terminal connected to the output terminal, a gate connected to the second node and a substrate terminal connected to the first node;

a seventh MOS transistor having a first terminal connected to the second node, a second terminal and a substrate terminal connected to the first node;

an eighth MOS transistor having a gate connected to the third node, a first terminal connected to the second terminal of the seventh MOS transistor, a second terminal connected to the first node and a substrate terminal connected to the first node;

a third MOS transistor having a gate connected to the third node, a first terminal connected to the output terminal and a substrate terminal connected to the first node;

a fourth MOS transistor having a gate connected to the internal power supply terminal, a first terminal connected to the second node, a second terminal connected to the output terminal and a substrate terminal connected to the first node;

a fifth MOS transistor having a gate connected to the second node, a first terminal connected to the first terminal of the first MOS transistor, a second terminal connected to the first node and a substrate terminal connected to the first node; and a sixth MOS transistor having a gate connected to the internal power supply terminal, a first terminal connected to the first node, a second terminal connected to the output terminal and a substrate terminal connected to the first node.

12. An output circuit, comprising:

an output terminal connected to an external circuit;

an internal power supply terminal;

a first node in a floating state;

a second node;

a third node;

a first MOS transistor having a first terminal connected to the internal power supply terminal, a second terminal connected to the output terminal, a gate connected to the second node and a substrate terminal connected to the first node;

a second MOS transistor having a gate connected to the internal power supply terminal, a first terminal connected to the second node, a second terminal connected to the third node and a substrate terminal connected to the first node;

a seventh MOS transistor having a first terminal connected to the second node, a second terminal and a substrate terminal connected to the first node; and an eighth MOS transistor having a gate connected to the third node, a first terminal connected to the second terminal of the seventh MOS transistor, a second terminal connected to the first node and a substrate terminal connected to the first node.

13. An output circuit according to claim 12, further comprising:

a third MOS transistor having a gate connected to the third node, a first terminal connected to the output terminal and a substrate terminal connected to the first node.

14. An output circuit according to claim 12, further comprising:

a fourth MOS transistor having a gate connected to the internal power supply terminal, a first terminal connected to the second node, a second terminal connected to the output terminal and a substrate terminal connected to the first node.

15. An output circuit according to claim 12, further comprising:

a fifth MOS transistor having a gate connected to the second node, a first terminal connected to the first terminal of the first MOS transistor, a second terminal connected to the first node and a substrate terminal connected to the first node.

16. An output circuit according to claim 12, further comprising:

a sixth MOS transistor having a gate connected to the internal power supply terminal, a first terminal connected to the first node, a second terminal connected to the output terminal and a substrate terminal connected to the first node.

17. An output circuit, comprising:

an output terminal connected to an external circuit;

an internal power supply terminal;

a first node in a floating state;

a second node;

a third node;

a first MOS transistor having a first terminal connected to the internal power supply terminal, a second terminal connected to the output terminal, a gate connected to the second node and a substrate terminal connected to the first node;

a second MOS transistor having a gate connected to the internal power supply terminal, a first terminal connected to the second node, a second terminal connected to the third node and a substrate terminal connected to the first node;

a seventh MOS transistor having a first terminal connected to the second node, a second terminal and a substrate terminal connected to the first node;

an eighth MOS transistor having a gate connected to the third node, a first terminal connected to the second terminal of the seventh MOS transistor, a second terminal connected to the first node and a substrate terminal connected to the first node;

a third MOS transistor having a gate connected to the third node, a first terminal connected to the output terminal and a substrate terminal connected to the first node;

a fourth MOS transistor having a gate connected to the internal power supply terminal, a first terminal connected to the second node, a second terminal connected to the output terminal and a substrate terminal connected to the first node;

a fifth MOS transistor having a gate connected to the second node, a first terminal connected to the first terminal of the first MOS transistor, a second terminal connected to the first node and a substrate terminal connected to the first node; and a sixth MOS transistor having a gate connected to the internal power supply terminal, a first terminal connected to the first node, a second terminal connected to the output terminal and a substrate terminal connected to the first node.

18. An output circuit according to claim 12, further comprising:

a fourth node connected to a gate of the seventh MOS transistor;

a fifth node;

a ninth MOS transistor having a gate connected to the fifth node, a first terminal connected to the internal power supply terminal and a second terminal connected to the fourth node; and a tenth MOS transistor having a gate connected to the fifth node, a first terminal connected to the fourth node and a substrate terminal connected to the fourth node.

19. An output circuit according to claim 18, further comprising:

a third MOS transistor having a gate connected to the third node, a first terminal connected to the output terminal and a substrate terminal connected to the first node.

20. An output circuit according to claim 18, further comprising:

a fourth MOS transistor having a gate connected to the internal power supply terminal, a first terminal connected to the second node, a second terminal connected to the output terminal and a substrate terminal connected to the first node.

21. An output circuit according to claim 18, further comprising:

a fifth MOS transistor having a gate connected to the second node, a first terminal connected to the first terminal of the first MOS transistor, a second terminal connected to the first node and a substrate terminal connected to the first node.

22. An output circuit according to claim 18, further comprising:

a sixth MOS transistor having a gate connected to the internal power supply terminal, a first terminal connected to the first node, a second terminal connected to the output terminal and a substrate terminal connected to the first node.

23. An output circuit, comprising:

an output terminal connected to an external circuit;

an internal power supply terminal;

a first node in a floating state;

a second node;

a third node;

a first MOS transistor having a first terminal connected to the internal power supply terminal, a second terminal connected to the output terminal, a gate connected to the second node and a substrate terminal connected to the first node;

a second MOS transistor having a gate connected to the internal power supply terminal, a first terminal connected to the second node, a second terminal connected to the third node and a substrate terminal connected to the first node;

a seventh MOS transistor having a first terminal connected to the second node, a second terminal and a substrate terminal connected to the first node;

an eighth MOS transistor having a gate connected to the third node, a first terminal connected to the second terminal of the seventh MOS transistor, a second terminal connected to the first node and a substrate terminal connected to the first node;

a third MOS transistor having a gate connected to the third node, a first terminal connected to the output terminal and a substrate terminal connected to the first node;

a fourth MOS transistor having a gate connected to the internal power supply terminal, a first terminal connected to the second node, a second terminal connected to the output terminal and a substrate terminal connected to the first node;

a fifth MOS transistor having a gate connected to the second node, a first terminal connected to the first terminal of the first MOS transistor, a second terminal connected to the first node and a substrate terminal connected to the first node; and a sixth MOS transistor having a gate connected to the internal power supply terminal, a first terminal connected to the first node, a second terminal connected to the output terminal and a substrate terminal connected to the first node;

a fourth node connected to a gate of the seventh MOS transistor;

a fifth node;

a ninth MOS transistor having a gate connected to the fifth node, a first terminal connected to the internal power supply terminal and a second terminal connected to the fourth node; and a tenth MOS transistor having a gate connected to the fifth node, a first terminal connected to the fourth node and a substrate terminal connected to the fourth node.

24. An input circuit, comprising:

an input terminal connected to an external circuit;

an output terminal;

an internal power supply terminal;

a first node in a floating state;

a second node;

a third node;

a first MOS transistor having a first terminal connected to the internal power supply terminal, a second terminal connected to the input terminal, a gate connected to the second node and a substrate terminal connected to the first node;

a second MOS transistor having a gate connected to the internal power supply terminal, a first terminal connected to the second node, a second terminal connected to the third node and a substrate terminal connected to the first node;

a seventh MOS transistor having a first terminal connected to the second node, a second terminal and a substrate terminal connected to the first node;

an eighth MOS transistor having a gate connected to the third node, a first terminal connected to the second terminal of the seventh MOS transistor, a second terminal connected to the first node and a substrate terminal connected to the first node;

a third MOS transistor having a gate connected to the third node, a first terminal connected to the input terminal, a second terminal connected to the output terminal and a substrate terminal connected to the first node;

a fourth MOS transistor having a gate connected to the internal power supply terminal, a first terminal connected to the second node, a second terminal connected to the input terminal and a substrate terminal connected to the first node;

a fifth MOS transistor having a gate connected to the second node, a first terminal connected to the first terminal of the first MOS transistor, a second terminal connected to the first node and a substrate terminal connected to the first node; and a sixth MOS transistor having a gate connected to the internal power supply terminal, a first terminal connected to the first node, a second terminal connected to the input terminal and a substrate terminal connected to the first node.

* * * * *